United States Patent [19]

Kaneyama

[11] Patent Number: 4,985,703
[45] Date of Patent: Jan. 15, 1991

[54] ANALOG MULTIPLEXER

[75] Inventor: Hideyo Kaneyama, Tokyo, Japan

[73] Assignee: NEC Corporation, Japan

[21] Appl. No.: 305,538

[22] Filed: Feb. 2, 1989

[30] Foreign Application Priority Data

Feb. 3, 1988 [JP] Japan .................................. 63-23482

[51] Int. Cl.$^5$ ............................................ H03K 17/56
[52] U.S. Cl. ..................................... 341/141; 307/243
[58] Field of Search ................ 341/136, 141; 307/243, 307/571

[56] References Cited

U.S. PATENT DOCUMENTS

| 4,551,634 | 11/1985 | Takahashi et al. | 307/243 |
| 4,556,804 | 12/1985 | Dewitt | 307/296 R |
| 4,645,944 | 2/1987 | Uya | 307/243 |
| 4,695,749 | 9/1987 | Lam | 307/455 |

Primary Examiner—William M. Shoop, Jr.
Assistant Examiner—Marc S. Hoff
Attorney, Agent, or Firm—Ostrolenk, Faber, Gerb & Soffen

[57] ABSTRACT

An analog multiplexer comprises MOS FET circuits of (n+1) in number corresponding to analog input terminals of (n+1) in number, and circuits of (n+1) in number for applying a fixed electric potential to the MOS FET circuits, where n is a positive integer (in =1, 2, 3, ...). The MOS FET circuit includes first and second MOS FET pairs each including n and p-channel MOS FETs which are connected to face each other. In a selected state of an analog signal, a corresponding MOS FET circuit is turned on in the application of a selection signal to gate electrodes of the n-channel MOS FETs and an inverted signal of the selection signal to gate electrodes of the p-channel MOS FETs. In a non-selected state of an analog signal, corresponding MOS FET circuits are turned on, and the fixed electric potential is applied to a connecting point between the first and second MOS FET pairs in each non-selected MOS FET circuit.

7 Claims, 3 Drawing Sheets

ANALOG MULTIPLEXER

FIELD OF THE INVENTION

The invention relates to an analog multiplexer, and more particularly to an analog multiplexer in which a predetermined analog input is selected from a plurality of analog inputs.

BACKGROUND OF THE INVENTION

An analog multiplexer is applied to such a use in which a predetermined analog input is selected for an input of an analog to digital converter from a plurality of analog inputs. A conventional analog multiplexer comprises (n+1) input terminals to which (n+1) analog inputs are supplied respectively, an output terminal from which a selected analog output is supplied to a following stage, and (n+1) MOS FET circuits each passing and stopping a corresponding analog input dependent on a selection signal applied thereto. Each of the (n+1) MOS FET circuits is composed of an n-channel MOS FET and a p-channel MOS FET which are connected to face each other wherein the selection signal is applied to a gate electrode of the n-channel MOS FET, while an inverted signal of the selection signal is applied to a gate electrode of the p-channel MOS FET. In the above, n is a positive integer (n=1, 2, 3 ...).

In operation, the (n+1) analog inputs are supplied to the (n+1) input terminals, and the selection signal applied to one of the (n+1) MOS FET circuits becomes "1", while the remaining selection signals applied to the remaining MOS FET circuits of n become "0". As a result, the n and p-channel MOS FETs are turned on in the MOS FET circuit to which the selection signal "1" is applied, so that an analog input supplied to a corresponding input terminal is passed through the selected MOS FET circuit to be transmitted to the output terminal, while the n and p-channel MOS FETs are turned off in the non-selected MOS FET circuits of (n+1) to which the selection signals "0" are applied, so that analog inputs of n supplied to the remaining input terminals of n are not transmitted to the output terminal. Thus, a predetermined analog input signal is selected from the (n+1) analog input signals.

In the conventional analog multiplexer, however, there is a disadvantage that an analog output is changed even in a change of non-selected analog inputs because the output terminal is slightly connected to non-selected input terminals due to parasitic capacitances between source and drain electrodes etc. of the MOS FET circuits.

SUMMARY OF THE INVENTION

Accordingly, it is an object of the invention to provide an analog multiplexer in which an analog output is not affected by input analog inputs in a state that the MOS FET circuit is turned off by the non-selection signals.

According to the invention, an analog multiplexer comprises MOS FET circuits of (n+1) in number corresponding to analog input terminals of (n+1) in number, and electric potential fixing circuits of (n+1) in number corresponding to the MOS FET circuits. Each of the MOS FET circuits comprises two pairs of MOS FETs such that each pair of the MOS FETs are composed of n and p-channel MOS FETs which are connected to face each other. A corresponding one of the potential fixing circuits is connected between the two pairs of the MOS FETs in a corresponding one of the MOS FET circuits, such that the potential fixing circuits apply a fixed electric potential such as the ground potential or a power supply voltage to connecting points between the two pairs of the MOS FETs in non-selected MOS FET circuits.

BRIEF DESCRIPTION OF DRAWINGS

The invention will be explained in more detail in conjunction with appended drawings wherein.

DESCRIPTION OF PREFERRED EMBODIMENTS

Figure 1:
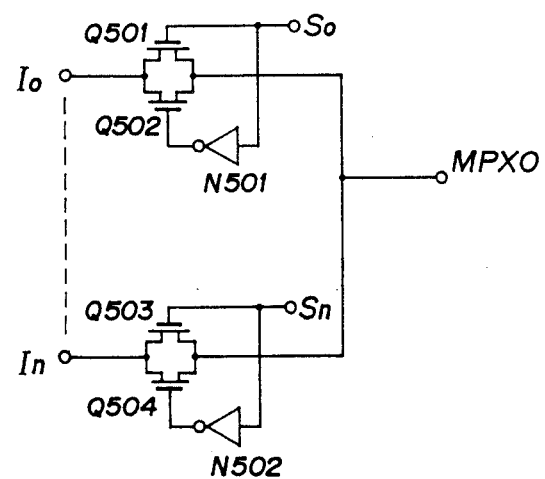
FIG. 1 is a circuit diagram showing a conventional analog multiplexer.

Before explaining an analog multiplexer in an embodiment according to the invention, the aforementioned conventional analog multiplexer will be explained in FIG. 1. The analog multiplexer comprises (n+1) MOS FET circuits correspondingly connected to (n+1) input terminals Io to In and commonly connected an output terminal MPXO. In the MOS FET circuit connected to the input terminal Io, Q501 is an n-channel MOS FET, and Q502 is a p-channel MOS FET. The n and p-channel MOS FETs are connected to face each other wherein a selection signal So is applied to a gate electrode of the n-channel MOS FET Q501 and to an inverter N501, an output of which is applied to a gate electrode of the p-channel MOS FET Q502. In the MOS FET circuit connected to the input terminal In, Q503 is an n-channel MOS FET, and Q504 is a p-channel MOS FET. The n and p-channel MOS FETs are connected to face each other wherein a selection signal Sn is applied to a gate electrode of the n-channel MOS FET Q503 and to an inverter N502, an output of which is applied to a gate electrode of the p-channel MOS FET Q504. Although input terminals $I_1$ to $I_{n-1}$ and MOS FET circuits connected thereto are not shown in FIG. 1, they are of the same circuit structure as explained above.

In operation, where the selection signal So is "1", the output of the inverter N501 is "0", so that the n and p-MOS FETs Q501 and Q502 are turned on, whereby an analog signal level at the input terminal Io is transmitted through the turned-on MOS FET circuit to the output terminal MPXO. On the other hand, where the selection signal So is "0", the output of the inverter N501 is "1", so that the n and p-MOS FETs Q501 and Q502 are turned off, whereby the analog signal level at the input terminal Io is not transmitted to the output terminal MPXO. In the same manner, the n and p-MOS FETs Q503 and Q504 are turned on, where the selection signal Sn is "1", while the n and p-MOS FETs Q503 and Q504 are turned off, where the selection signal Sn is "0". Thus, the analog signal levels at the input terminals Io to In are controlled to be transmitted to the output terminal MPXO dependent on a content of the selection signals So to Sn.

Figure 2:
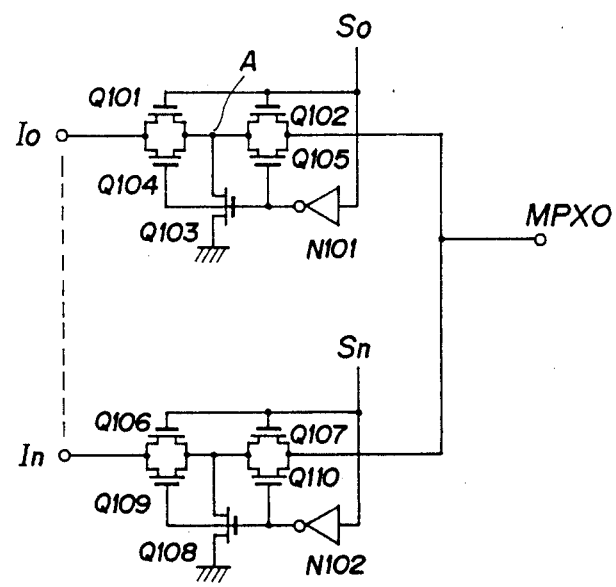
FIGS. 2 and 3 are circuit diagrams showing analog multiplexers in first and second embodiments according to the invention.

FIG. 2 shows an analog multiplexer in a first embodiment according to the invention which comprises MOS FET circuits of (n+1) in number correspondingly connected to input terminals of (n+1) in number and commonly connected to an output terminal MPXO. In the MOS FET circuit connected to the input terminal Io, n and p-channel MOS FETs Q101 and Q104 are connected to face each other to provide a first MOS FET pair, while n and p-channel MOS FETs Q102 and Q105 are connected to face each other to provide a second MOS FET pair, wherein the first and second MOS FET pairs are connected in series, and an n-channel MOS FET Q103 is inserted between a connecting point A of the first and second MOS FET pairs and the ground. Further, a selection signal So is applied to gate electrodes of the n-channel MOS FETs Q101 and Q102 and to an inverter N101, an output of which is applied to gate electrodes of the MOS FETs Q103, Q104 and Q105. The MOS FET circuit connected to the input terminal In is of the same circuit structure as that connected to the input terminal Io, wherein Q106, Q107 and Q108 are n-channel MOS FETs, Q109 and Q110 are p-channel MOS FETs, N102 is an inverter, and Sn is a selection signal.

In operation, where the selection signal So is "1", the output of the inverter N101 is "0", so that the MOS FETs Q101, Q102, Q104 and Q105 are turned on, while the MOS FET Q103 is turned off. Consequently, an analog signal level applied to the input terminal Io is transmitted through the MOS FET circuit to the output terminal MPXO because the connecting point A is not connected to the ground due to the turning-off of the MOS FET Q103. On the other hand, where the selection signal So is "0", the MOS FETs Q101, Q102, Q104 and Q105 are turned off, and the MOS FET Q103 is turned on, so that an output level at the output terminal MPXO is not affected due to the connecting point A connected to the ground even if an input signal level at the input terminal Io is changed. In the same manner as described above, where the selection signal Sn is "1", the MOS FETs Q106, Q107, Q109 and Q110 are turned on, and the MOS FET Q108 is turned off. On the other hand, where the selection signal Sn is "0", the MOS FETs Q106, Q107, Q109 and Q110 are turned off, and the MOS FET Q108 is turned on so that a connecting point between a first MOS FET pair Q106 and Q109 and a second MOS FET pair Q107 and Q110 is connected to the ground.

Figure 3:
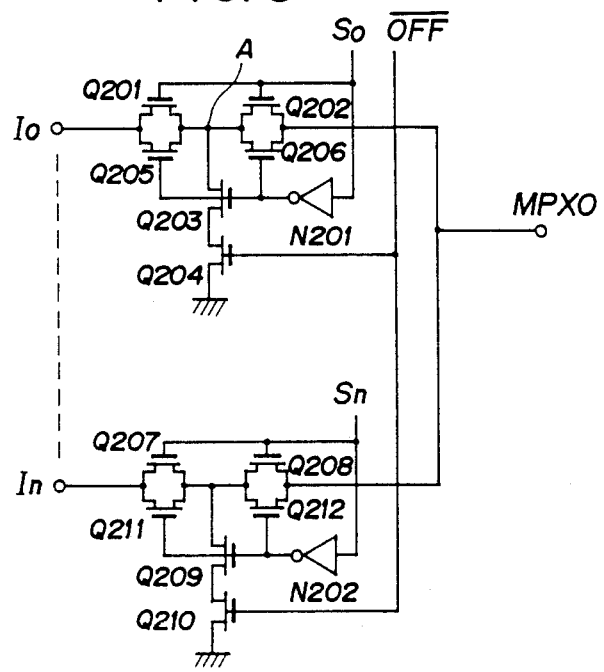
Figure 4:
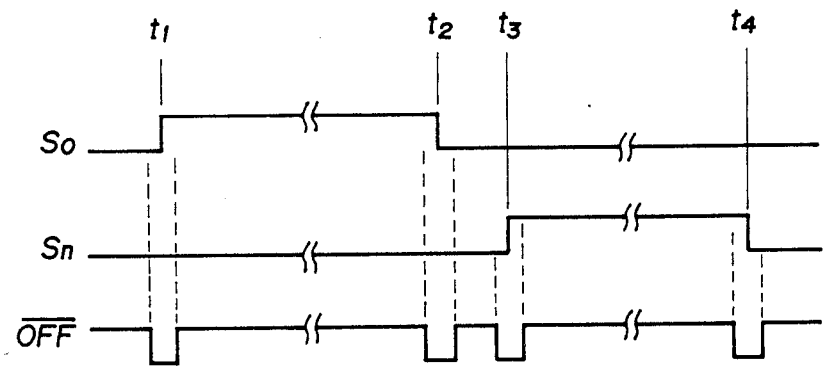
FIG. 4 is a timing chart showing an operation of the invention.

FIG. 3 shows an analog multiplexer in a second embodiment according to the invention. In the analog multiplexer, Q201 to Q204 and Q207 to Q210 are n-channel MOS FETs, Q205, Q206, Q211 and Q212 are p-channel MOS FETs, and N201 and N202 are inverters. As clearly shown in FIG. 3, the n-channel MOS FETs Q204 and Q210, to gate electrodes of which a control signal $\overline{OFF}$ is applied, are added to the circuit structure of the first embodiment.

In operation, the control signal $\overline{OFF}$ of "0" is applied to the MOS FETs Q204 and Q210 during a predetermined duration including times $t_1$ to $t_4$ at which the selection signals So and Sn rise up and fall down, so that the ground potential is prevented from being supplied to the input terminals Io to In at respective transient times.

Figure 5:
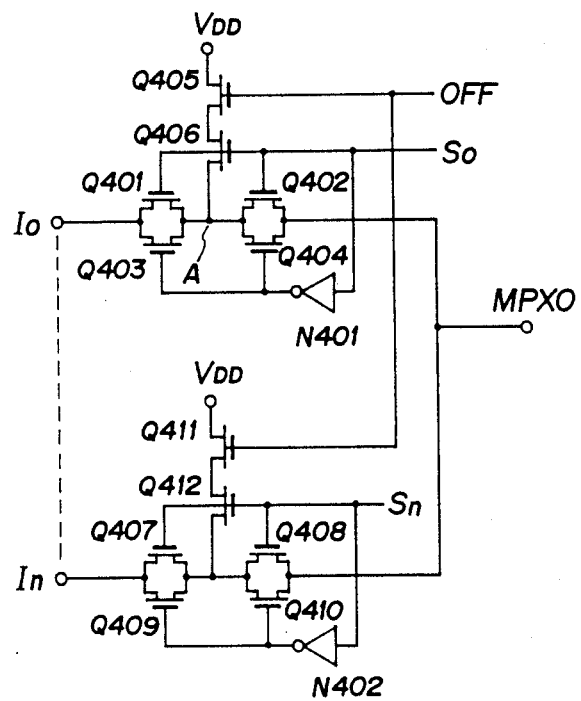
FIG. 5 is a circuit diagram showing an analog multiplexer in a third embodiment according to the invention.

FIG. 5 shows an analog multiplexer in a third embodiment according to the invention. The analog multiplexer is the same circuit structure as that in the second embodiment, except that a connecting point A between first and second MOS FET pairs is connected to a power supply potential VDD, where the selection signals So to Sn are "0". In the analog multiplexer, Q401, Q402, Q407 and Q408 are n-channel MOS FETs, Q403 to Q406 and Q409 to Q412 are p-channel MOS FETs, and N401 and N402 are inverters.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An analog multiplexer for selecting one of (n+1) analog input signals, where n is a positive integer equal to or greater than one, which analog multiplexer comprises:
    (n+1) MOS FET circuits, each MOS FET circuit having an input connectable to one of the input analog signals and each having an output connected to a common output terminal from which a selected analog signal may be supplied to a following stage, each of said MOS FET circuits including a set of serially connected MOS FETs and each being responsive to a digital selection signal having two states to either transmit an analog signal at its input to the common output terminal or to block such transmission;
    means for selectively applying a digital selection signal of one of the states to a selected one of the MOS FET circuits, while applying a digital selection signal of the other state to the other MOS FET circuits to transmit the analog signal from the input of the selected MOS FET circuit to the common output, while blocking transmission of an analog signal on the input to any other MOS FET circuit to the common output;
    means responsive to the other state of the digital selection signal for applying a fixed electric potential to a serial connecting point of the set of serially connected MOS FETs; and
    means for inhibiting the application of the fixed electric potential to the serial connecting point during a predetermined time duration including a time at which the digital selection signal changes between one state and the other state.

2. An analog multiplexer according to claim 1, wherein each of said MOS FET circuits includes first and second MOS FET pairs, each of said first and second MOS FET pairs including n- and p- channel MOS FETs which are connected face to face.

3. An analog multiplexer according to claim 2, in which said applying means applies ground potential to the serial connecting point between the first and second MOS FET pairs.

4. An analog multiplexer according to claim 2, wherein the applying means applies a predetermined positive voltage to the serial connecting point between the first and second MOS FET pairs.

5. An analog multiplexer according to claim 1, wherein the applying means and the inhibiting means are serially connected between the serial connecting point and a source of the fixed electric potential.

6. An analog multiplexer according to claim 3, wherein the applying means and the inhibiting means are n-channel MOS FETs.

7. An analog multiplexer according to claim 3, wherein the applying means and the inhibiting mean are p-channel MOS FETs.

* * * * *